US008894774B2

(12) United States Patent
Duong

(10) Patent No.: US 8,894,774 B2
(45) Date of Patent: Nov. 25, 2014

(54) COMPOSITION AND METHOD TO REMOVE EXCESS MATERIAL DURING MANUFACTURING OF SEMICONDUCTOR DEVICES

(75) Inventor: Anh Duong, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 575 days.

(21) Appl. No.: 13/094,967

(22) Filed: Apr. 27, 2011

(65) Prior Publication Data

US 2012/0273010 A1    Nov. 1, 2012

(51) Int. Cl.
*C11D 7/32* (2006.01)
*C11D 7/26* (2006.01)
*C11D 7/34* (2006.01)
*C11D 7/50* (2006.01)
*H01L 21/285* (2006.01)
*H01L 21/02* (2006.01)

(52) U.S. Cl.
CPC .............. *C11D 7/3209* (2013.01); *C11D 7/263* (2013.01); *C11D 7/3218* (2013.01); *C11D 7/34* (2013.01); *C11D 7/5013* (2013.01); *C11D 7/5022* (2013.01); *H01L 21/28518* (2013.01); *H01L 21/02068* (2013.01)
USPC .......... 134/26; 134/2; 134/3; 134/41

(58) Field of Classification Search
CPC .... C11D 7/263; C11D 7/3209; C11D 7/3218; C11D 7/34; C11D 7/5013; C11D 7/5022; H01L 21/02068
USPC ................. 134/26, 2, 3, 41; 510/175
See application file for complete search history.

(56) References Cited

U.S. PATENT DOCUMENTS

| 5,795,492 | A | 8/1998 | Reis | |
| 6,432,836 | B1 * | 8/2002 | Watanabe | 438/745 |
| 2005/0014667 | A1 * | 1/2005 | Aoyama et al. | 510/175 |
| 2006/0144791 | A1 | 7/2006 | Debe et al. | |
| 2006/0172907 | A1 * | 8/2006 | Kim et al. | 510/175 |
| 2006/0266737 | A1 | 11/2006 | Hanestad | |
| 2007/0020925 | A1 | 1/2007 | Hsieh et al. | |
| 2008/0004197 | A1 * | 1/2008 | Kneer | 510/245 |
| 2009/0127594 | A1 * | 5/2009 | Arunachalam et al. | 257/288 |
| 2010/0105595 | A1 * | 4/2010 | Lee | 510/176 |

OTHER PUBLICATIONS

Chen, Y., et al.; Advances on 32nm NiPt Salicide Process; Jan. 1, 2009; IEEE; 17th IEEE International Conference on Advanced thermal Processing of Semiconductors 4 pages.
Xu, K., et al.; Post Salicidation Clean Selective Removal of Unreacted NiPt towards NiPtSiGe; Jan. 1, 2007; IMEC; Xu K. et al.
Baghalha, M., et al.; Kinetics of Platinum Extracton From Spent Reforming Catalysts in AquaRegia Solutions; Jun. 17, 2008; Sharif University of Technology, Iran; Hydrometallurgy vol. 95 Issues 34 pp. 247253.

(Continued)

*Primary Examiner* — Michael Kornakov
*Assistant Examiner* — Katelyn Whatley

(57) ABSTRACT

A composition of matter and method to remove excess material during the manufacturing of semiconductor devices includes providing a substrate; applying a metal chelator mixture to the substrate, where the metal chelator mixture comprising a metal chelator and a solvent, where the metal chelator binds to the platinum residue, to render the platinum residue soluble; and rinsing the metal chelator mixture from the substrate to remove the platinum residue from the silicide.

20 Claims, 2 Drawing Sheets

(56) References Cited

OTHER PUBLICATIONS

Hoummada, K., et al.; Effect of Pt Addition on Ni Silicide Formation at Low Temperature Growth Redistribution and Solubility; Sep. 21, 2009; 1Aix-Marseille Université, France; Journal of Applied Physics pp. 106114.

Demeulemeester, J., et al.; Pt Redistribution During NiPt Silicide Formation; Dec. 31, 2008; 1Instituut voor Kern-en Stralingsfysica and INPAC, Belgium; Applied Physics Letters pp. 9395.

Jafarifar, D., et al.; Ultra Fast MicrowaveAssisted Leaching for Recovery of Platinum from Spent Catalyst; Jan. 1, 2005; Jam Petrochemical Company, Iran; Hydrometallurgy pp. 166171.

* cited by examiner ents herein. Accordingly, the examples should not be construed as limiting the scope of the embodiments herein.

The embodiments herein provide a novel composition and method to safely and effectively render platinum and other residuals (e.g., NiPt/Pt) soluble. Referring now to the drawings, and more particularly to FIGS. 1 through 4, where similar reference characters denote corresponding features consistently throughout the figures, there are shown various embodiments.

FIG. 1 illustrates a schematic diagram of a device 1 with platinum residue 40, according to an embodiment herein. As shown in FIG. 1, device 1 includes a substrate 10, source 15, drain 20, polysilicon (PolySi) 25, silicon nitride (SiN) 30, nickel-platinum silicide (NiPtSi) 35, and platinum (Pt) 40. According to one embodiment herein, device 1 is a field effect transistor (FET) and PolySi 25 is a gate for device 1, SiN 30 is an insulator for device 1, and NiPtSi 35 are contact electrodes for source 15, drain 20, and PolySi 25. In addition, as shown in FIG. 1, device 1 is surrounded by Pt particles 40. According to one embodiment herein, as described below, Pt particles 40 constitute residual material from an annealing process used to form NiPtSi 35. For example, during the fabrication of device 1, the following may occur to produce Pt particles 40: a pre-clean step; deposition of nickel-platinum (10% Pt) film (e.g., approximately 100 Å thick); a first rapid thermal annealing ($RTA_1$) at a temperature range of approximately 200° C. to 400° C.; stripping the excess nickel material using a sulfuric acid—hydrogen peroxide mixture (SPM) at approximately 120° C. (i.e., the NiPt strip); a second rapid thermal annealing ($RTA_2$) at a temperature range of approximately 400° C. to 600° C.; and stripping the excess platinum material (i.e., the Pt strip).

FIG. 2, with reference to FIG. 1, illustrates a method for improving the removal of Pt during FEOL processing, according to one embodiment herein. In the method shown in FIG. 2, step 50 includes preparing blanket wafers. For example, according to one embodiment herein, three blanket wafers are prepared—where a first blanket wafer includes NiPt (with 10% Pt), a second blanket wafer includes NiPt plus an $RTA_1$ process, and a third blanket wafer includes NiPt plus an $RTA_2$ process. Step 52 includes identifying possible chemistries. According to one embodiment herein, possible chemistries include $HNO_3$, HCl, $H_2O_2$, $O_3$, sulfuric acid-ozone mixture (SOM), and SPM. Step 54 includes measuring the removal rates of Pt on the blanket wafers (e.g., on the first, second and third blanket wafers, as described above). Step 56 includes testing the performance (e.g., removal rates of Pt) of the chemistries identified in step 52. Next, the method of FIG. 2 checks (in step 58) for Pt removal and measures the removal rate of oxides and nitrides (e.g., $SiO_2$ and $Si_3N_4$) from the blanket wafer.

According to one embodiment herein, the measurements taken in steps 54 and 58 are performed using a scanning electron microscopy (SEM) instrument. For example, a Magellan 400L SEM instrument available from FEI Company, Hillsboro, Oreg., USA is used to measure the removal of Pt in step 54 with the following scanning parameters: low voltage high contrast detector (vCD) mode collecting backscattering electrons (BSE), where high voltage (HV)=−5 kV, specimen bias voltage (SB)=−3 kV and current=−100 pA. According to one embodiment of step 54, for example, SEM images of a prepared blanket coupon (such as a SiN substrate in step 50) are taken at different locations that are exposed to different chemistries (as described in further detail below). The images are then processed through image analysis software (e.g., ImageJ, available from the National Institutes of

COMPOSITION AND METHOD TO REMOVE EXCESS MATERIAL DURING MANUFACTURING OF SEMICONDUCTOR DEVICES

BACKGROUND

1. Technical Field

The embodiments herein generally relate to semiconductor processing, and, more particularly, to the removal of excess noble metal material during contact electrode processing.

2. Description of the Related Art

In conventional semiconductor processing systems, many dangerous chemicals are used simply because an alternative has not been found. For example, during contact electrode processing in a front end of line (FEOL) application, aqua regia is commonly used to remove unreacted platinum and platinum metal alloys (e.g., NiPt/Pt). Aqua regia is a mixture of nitric acid and hydrochloric acid, usually in a molar ratio of 1:3. Moreover, when used as a solvent, aqua regia typically forms shallow craters devoid of silicide in the Ni(Pt)Si film. Moreover, aqua regia is very corrosive and highly flammable.

These factors contribute to making aqua regia an undesirable compound for use in industrial processes. Aqua regia, however, is used in conventional systems because it is known to dissolve Pt and thereby resulting in soluble hexachloroplatinic acid. Ideally, aqua regia dissolves Pt because it is a mixture of nitric acid ($HNO_3$) and hydrochloric acid (HCl). Since nitric acid is a powerful oxidizer, it will dissolves Pt to form platinum ions ($Pt^{4+}$). Thereafter, the oxidized platinum ions react with chloride ions from the hydrochloric acid resulting in the chloroplatinate ion. Industrial use of aqua regia to dissolve Pt and form hexachloroplatinic acid, however, is far from ideal and leaves undesirable amounts of Pt and Pt residues during, for example, contact electrode processing in a FEOL application.

Therefore, what is needed is a composition and method that allows for the safe removal of advanced materials (e.g., platinum) during semiconductor processing and manufacturing.

BRIEF DESCRIPTION OF THE DRAWINGS

The embodiments herein will be better understood from the following detailed description with reference to the drawings, in which.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodi- Health, USA) to determine the presence of Pt residues after reducing the background noise due to a change in roughness after chemical treatment.

According to one embodiment herein, an atomic force microscopy (AFM) instrument is used to measure the roughness change after a chemical exposure to the SiN substrate (as described in further detail below) instead of SEM instrumentation. For example, a DIM5000 AFM instrument available from Veeco Instruments, Inc., Plainview, N.Y., USA is used in step 54 to measure the roughness change after chemical exposure with the following parameters:scan rate: 0.996 Hz, tip velocity: 9.96 um/s. Data scale: 20 nm. According to one embodiment herein, roughness for pre and post conditions are then calculated and the roughness of the thin film deposition indicates the degree of Pt removal (e.g., 25-35 nm). For example, the greater the removal of Pt, the smoother the surface. To measure the oxide and nitrides etch rate in step 58 according to one embodiment herein, a film's thickness is measured on an ellipsometer (e.g., ellipsometers available from Gaertner Scientific Corp., Skokie, Ill., USA) at pre and post chemical exposure. The delta thickness (i.e., the difference in thickness between pre and post chemical exposure) obtained from pre and post exposures indicates the etch rate of oxide or nitride (e.g., 25-35 nm).

Figure 1:
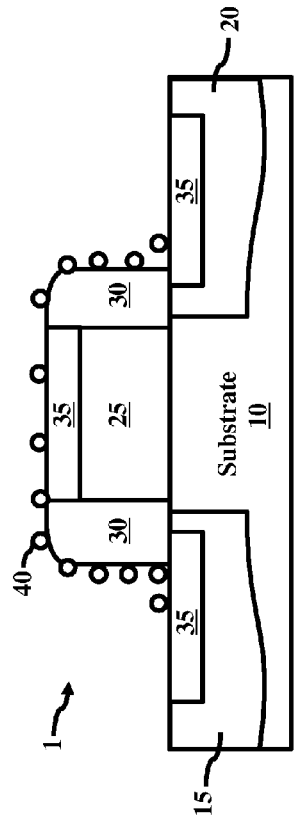
FIG. 1 illustrates a schematic diagram of platinum residuals on an integrated circuit material according to the embodiments herein.
Figure 2:
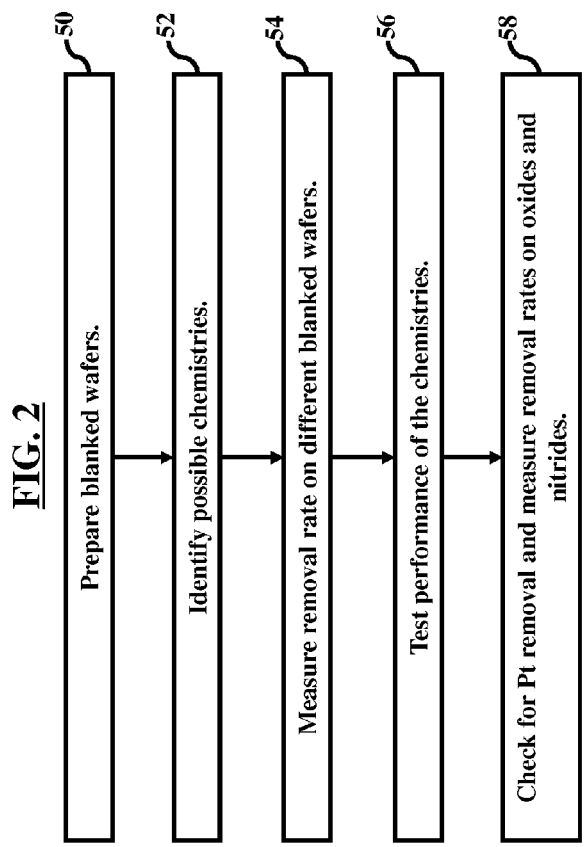
FIG. 2 illustrates a flow diagram of a test method according to the embodiments herein.
Figure 3:
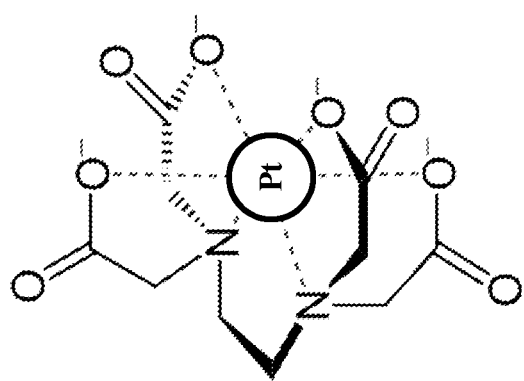
FIG. 3 illustrates a chemical diagram of a metal chelator composition according to the embodiments herein.

According to one embodiment herein, a metal chelator is used to bind to Pt (e.g., Pt 40) thereby making the Pt soluble in a solution. FIG. 3, with reference to FIGS. 1 and 2, illustrates a chemical diagram of a metal chelator according to the embodiments herein. Examples of metal chelators include, but are not limited to, linear alkyl or aromatic compounds containing an amine group such as monoethanolamine, diethanolamine, triethanolamine, diglycolamine, or mono, di, or multi-hydroxybenzene type compounds such as ethylendiamine. According to one embodiment herein, linear or aromatic compounds containing thiol group such as 1-propanethiol, 2-propanethiol, butanethiol, pentanethiols, cysteine, 2-mercaptoethanol, 2-mercaptoindole are included. Moreover, linear or aromatic compounds containing a carboxylic acid group such as acrylic acid, benzoic acid, adipic acid, or linear or aromatic compounds containing two or three carboxyl groups such as adipic acid, citric acid, glyceric acid, glycolic acid, and lactic acid are included according to one embodiment herein. Metal chelators can also be a metal sequestering polymer or oligomer that will bind to the Pt metal. According to one embodiment, these polymers and/or oligomers can be linear or branched that contain primary, and or secondary, and or tertiary amines. Examples of such metal chelators include polyalkylamines and polyarylamines. According to one embodiment herein, the concentration of such metal chelators is approximately between 1% to 10% by weight.

According to one embodiment herein, the metal chelator illustrated in FIG. 3 is part of a mixture utilized in the method illustrated in FIG. 2 (e.g., as part of a design of experiments in step 56). Such a metal chelator mixture may include, for example, a metal chelator (e.g., as shown in FIG. 3) that binds selectively to Pt (e.g., Pt 40); an organic solvent to keep the metal chelators+Pt in solution; <2.5% of fluoride to selectively etch SiN; and $H_2O$. According to one embodiment herein, solvents include either glycol group solvent such as propylene glycol, diethylenglycol methyl ether, diethyleneglycol ethyl ether, or amine group solvent such as diglycolamine, n-ethyl pyrrolidone, N— hydroxyethyl-2-pyrolidone, N-methylethanolamine. In addition, according to one embodiment herein, the concentration of such solvents is between approximately 5% to 90% by volume. In addition, such organic solvents improve surface tension and maintain the pH level of the mixture. The metal chelator mixture also includes a corrosion inhibitor, according to one embodiment herein.

Figure 4:
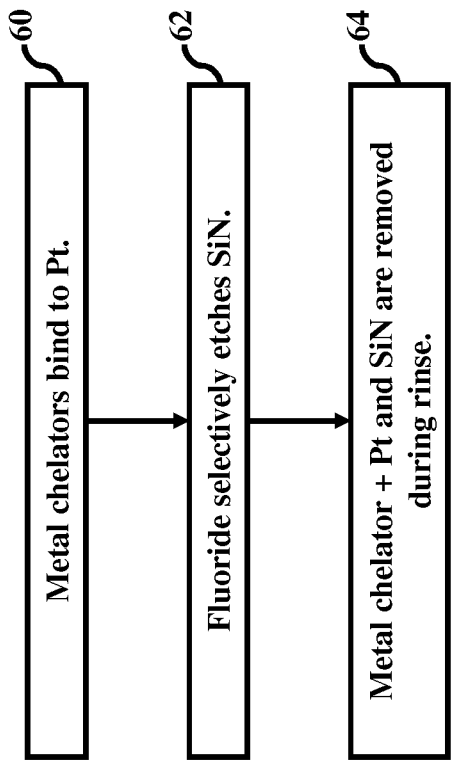
FIG. 4 illustrates a flow diagram of a metal chelator method according to an embodiment herein.

Furthermore, according to one embodiment herein, the metal chelator mixture described above is a solution employed in the method shown in FIG. 4, with reference to FIGS. 1 through 3. As shown in step 60, metal chelators (e.g., as shown in FIG. 3) bind to Pt (e.g., Pt particles 40) making it soluble in a solution (e.g., as described above). In step 62, the fluoride present in the solution selectively etches the SiN layer 30 at a controllable rate. Examples of fluoride containing components include, but are not limited to: hydrogen fluoride, ammonium hydrogen difluoride, ammonium fluoride, ammonium bifluoride, alkylammonium fluoride, fluorosilicic acid, or fluoroacetic acid. According to one embodiment herein, the concentration of such fluoride containing compounds in solution is between approximately 0.1% to 2.5%. Next, in the method shown in FIG. 4, the metal chelator plus Pt and SiN are removed (in step 64) during a water rinse. According to one embodiment of the rinse, for example, the foregoing chemicals are removed from the substrate during the first 10 seconds. Water is then flowed onto the substrates at a constant rate (e.g., approximately 1 liter/min). A vacuum line (not shown) simultaneously removes this water at a lower rate (e.g., approximately 0.5 liter/min) so that the substrate surface is constantly flushed with fresh water. According to one embodiment herein, the foregoing water rinse time is between 2 to 5 minutes. After 5 minutes the water is completely shut off and the vacuum line completely removes the water.

According to one embodiment herein, a method to improve the fabrication process of device 1, as described above, includes several parameters. For example, to improve the FEOL application of Pt and the removal of NiPt with an underlying Ni silicide (e.g., NiPtSi 40), different processing techniques may be used to identify chemistries and processes that have the following parameters: the process temperature must be as low as possible (e.g., ≤40° C., but less than 200° C. to preserve the integrity of materials such as high-k dielectrics and the metal gate materials); process time must not exceed approximately 5 minutes for a batch and approximately 1 ms for a single wafer (e.g., a single chemistry solution to remove NiPt preferred to dual chemistry solution to remove NiPt then Pt—which yields undesirable times of approximately 10 minutes for the batch and approximately 2 minutes for a single wafer); process must not exceed an etch threshold for silicides (e.g., where an etch threshold is defined as <5 Å loss of material); process must not exceed an etch threshold for oxides and nitrides (e.g., where a etch threshold is defined as <5 Å loss of material); a list of chemicals that are not allowed (e.g., n-methylpyrrolidone, dimethylacetamide, diglycolamine, hydroxylamine); and the chemistry must be compatible with industrial sink, drain, and waste treatment (e.g., no flocculation or precipitation, aqueous-based solutions preferred).

As described above, one of the aspects of the embodiments herein is that the previously insoluble residues (e.g., Pt/NiPt residues) can be completely removed without the use of highly corrosive compounds (e.g., aqua regia) that causes unintentional side effects (e.g., forming shallow craters devoid of silicide in the Ni(Pt)Si film). In addition, the embodiments herein provide chemistries requiring short process times. Accordingly, due to the short process times, embodiments herein permit single wafer wet processing tools to be used in manufacturing environments. Furthermore, the embodiments herein provide a method permitting testing of many different formulations and chemistries in a very short time. Therefore, for example, by using a metal chelator and HF concentration in an organic solvent and water, previously insoluble compounds used during contact electrode processing—such as NiPt or other Pt residuals—can become soluble in accordance with the embodiments herein. With a soluble platinum residual, for example, and after a given process time, the embodiments herein undercut the SiN and lift off the Pt residue during the final rinse step.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of illustrated embodiments, those skilled in the art will recognize that the embodiments herein can be practiced with modification within the spirit and scope of the appended claims.

What is claimed is:

1. A method for removing platinum residues during semiconductor processing and manufacturing, said method comprising:
   providing a substrate;
   applying a metal chelator mixture to said substrate,
      said metal chelator mixture comprising a metal chelator and a solvent,
      wherein the metal chelator comprises a carboxylic acid group,
      wherein said metal chelator selectively binds to said platinum residues thereby rendering said platinum residues bound to the metal chelator soluble in the metal chelator mixture; and
   rinsing said metal chelator mixture to selectively remove said platinum residues from said substrate.

2. The method of claim 1, wherein said metal chelator binds to at least one of NiPt and Pt of said platinum residues.

3. The method of claim 1, wherein said substrate further comprises NiPtSi.

4. The method of claim 1, wherein said metal chelator mixture further comprises a fluoride selected from the group consisting of hydrogen fluoride, ammonium difluoride, ammonium fluoride, ammonium bifluoride, alkylammonium fluoride, fluorosilic acid or fluoroacetic acid.

5. The method of claim 4, wherein said fluoride comprises hydrogen fluoride.

6. The method of claim 4, wherein said fluoride has a concentration of between 0.1% and 2.5% by weight.

7. The method of claim 1, wherein said solvent comprises an organic solvent and water.

8. The method of claim 1, wherein said metal chelator mixture further comprises a corrosion inhibitor.

9. The method of claim 1, further comprising, prior to applying a metal chelator mixture to said substrate,
   processing said substrate through a first rapid thermal annealing process, the substrate comprising nickel and platinum;
   stripping excess nickel material from said substrate; and
   processing said substrate through a second rapid thermal annealing process.

10. The method of claim 1, wherein applying said metal chelator mixture occurs during front end of line (FEOL) fabrication of a semiconductor device.

11. The method of claim 1, wherein applying said metal chelator mixture occurs with an ambient temperature surrounding said substrate of less than 200° C.

12. A method for removing platinum residues, said method comprising:
   providing a platinum residue, a silicide, a nitride, and nickel-platinum on a device;
   applying a metal chelator mixture to said device,
      said metal chelator mixture comprising a metal chelator and a solvent,
      wherein the metal chelator comprises a carboxylic acid group;
      wherein said metal chelator selectively binds to said platinum residue, thereby rendering said platinum residue bound to the metal chelator soluble in the metal chelator mixture; and
   removing said platinum residue by rinsing said device.

13. The method of claim 12, wherein said metal chelator binds to at least one of NiPt and Pt of said platinum residues.

14. The method of claim 13, wherein said nickel-platinum comprises NiPtSi.

15. The method of claim 12, wherein applying said metal chelator mixture to said device occurs at a temperature of less than 200° C.

16. The method of claim 1, wherein the metal chelator is one of adipic acid citric acid, glyceric acid, glycolic acid, or lactic acid.

17. The method of claim 1, wherein the metal chelator is a citric acid.

18. The method of claim 1, wherein the metal chelator is a glyceric acid.

19. The method of claim 1, wherein the metal chelator is a glycolic acid.

20. The method of claim 1, wherein the metal chelator is a lactic acid.

* * * * *